(12) United States Patent
Bonazzoli et al.

(10) Patent No.: US 10,720,688 B2
(45) Date of Patent: Jul. 21, 2020

(54) RF TRANSITION ASSEMBLY COMPRISING AN OPEN COAXIAL STRUCTURE WITH A CAVITY FOR RECEIVING A CONDUCTOR THAT IS COUPLED ORTHOGONAL TO AN RF TRANSMISSION LAYER

(71) Applicant: Oclaro Technology Limited, Northamptonshire (GB)

(72) Inventors: Mario Bonazzoli, Cremona (IT); Roberto Galeotti, Giussago (IT); Luigi Gobbi, Milan (IT)

(73) Assignee: Lumentum Technology UK Limited, Northamptonshire (GB)

( * ) Notice: Subject to any disclaimer, the term of this patent is extended or adjusted under 35 U.S.C. 154(b) by 3 days.

(21) Appl. No.: 16/090,557

(22) PCT Filed: Apr. 24, 2017

(86) PCT No.: PCT/GB2017/051127
§ 371 (c)(1),
(2) Date: Oct. 1, 2018

(87) PCT Pub. No.: WO2017/187142
PCT Pub. Date: Nov. 2, 2017

(65) Prior Publication Data
US 2019/0124759 A1 Apr. 25, 2019

(30) Foreign Application Priority Data
Apr. 26, 2016 (GB) .................................. 1607216.7

(51) Int. Cl.
*H01P 5/08* (2006.01)
*H01P 1/04* (2006.01)
(Continued)

(52) U.S. Cl.
CPC .............. *H01P 5/085* (2013.01); *H01P 1/045* (2013.01); *H01P 1/047* (2013.01); *H05K 1/0251* (2013.01);
(Continued)

(58) Field of Classification Search
CPC ........... H01P 5/085; H01P 1/045; H01P 1/047
(Continued)

(56) References Cited

U.S. PATENT DOCUMENTS 3,757,272 A 9/1973 Laramee et al.
4,951,011 A * 8/1990 Heckannan et al. .... H01L 23/66
333/33
(Continued)

FOREIGN PATENT DOCUMENTS

EP 2 958 188 A1 12/2015

OTHER PUBLICATIONS

Intellectual Property Office of the United Kingdom, Patents Act 1977: Search Report under Section 17(5), Application No. GB1607216.7, dated Sep. 27, 2016, 3 Pages.
(Continued)

*Primary Examiner* — Benny T Lee
(74) *Attorney, Agent, or Firm* — Harrity & Harrity, LLP (57) ABSTRACT

An RF transition assembly (300) for enabling a radiofrequency transition between an RF transmission layer (301) of an electronic device and a conductor (309) which is electrically connected (317) to the RF transmission layer (301). The conductor (309) extends generally orthogonal to the RF transmission layer (301). The assembly comprises an open coaxial structure (313) located adjacent to an edge of the RF transmission layer (301). The open coaxial structure (313) comprises a cavity (315) extending therethrough for receiving the conductor (309). The cavity (315) comprises an opening facing the edge of the RF transmission layer (301)
(Continued)

so as to direct electromagnetic radiation towards the RF transmission layer (301).

20 Claims, 7 Drawing Sheets

(51) Int. Cl.
*H05K 1/02* (2006.01)
*H01R 24/50* (2011.01)

(52) U.S. Cl.
CPC ............ *H01R 24/50* (2013.01); *H05K 1/0222* (2013.01); *H05K 2201/093* (2013.01); *H05K 2201/09618* (2013.01); *H05K 2201/09809* (2013.01); *H05K 2203/049* (2013.01)

(58) Field of Classification Search
USPC .................................................. 333/33, 260
See application file for complete search history.

(56) References Cited

U.S. PATENT DOCUMENTS

| | | | |
|---|---|---|---|
| 5,356,298 A | 10/1994 | Voss et al. | |
| 5,797,765 A * | 8/1998 | Barnett et al. | H01R 24/50 |
| | | | 333/260 |
| 7,484,900 B2 | 2/2009 | Galeotti et al. | |
| 7,750,764 B2 * | 7/2010 | Snodgrass et al. | H01P 5/085 |
| | | | 333/260 |
| 2004/0038587 A1 | 2/2004 | Yeung et al. | |
| 2010/0289596 A1 | 11/2010 | Makino et al. | |
| 2015/0035615 A1 | 2/2015 | Boone et al. | |
| 2016/0365684 A1* | 12/2016 | Li et al. | H01R 24/44 |

OTHER PUBLICATIONS

Keen, K.M., et al., "Characteristic impedance of dielectric-filled slotted coaxial transmission line," Proceedings of the Institution of Electrical Engineers, Stevenage, GB, vol. 123, No. 10, Oct. 1, 1976, pp. 981-983, XP002012428.

Patent Cooperation Treaty, International Search Report and Written Opinion of the International Searching Authority, International Patent Application No. No. PCT/GB2017/051127, dated Jul. 11, 2017, 17 Pages.

* cited by examiner

Figure 1

Prior Art

Figure 2

Prior Art

RF TRANSITION ASSEMBLY COMPRISING AN OPEN COAXIAL STRUCTURE WITH A CAVITY FOR RECEIVING A CONDUCTOR THAT IS COUPLED ORTHOGONAL TO AN RF TRANSMISSION LAYER

RELATED APPLICATIONS

This application is a 35 U.S.C. 371 national stage filing of International Application No. PCT/GB2017/051127, filed on Apr. 24, 2017, which claims priority from United Kingdom Application No. GB1607216.7 filed on Apr. 26, 2016. The contents of the aforementioned applications are hereby incorporated by reference in their entireties.

FIELD OF THE INVENTION

The present invention generally relates to radiofrequency structures. More particularly, the invention relates to radiofrequency structures comprising a transition between layers in packages for electronic or optoelectronic devices.

BACKGROUND

Electronic devices such as optoelectronic devices are frequently formed in assemblies which contain components which are arranged in multilayer structures. There is therefore a need for structures comprising angled transitions to connect electronic components located in layers of differing heights. For example, surface mounted devices are typically powered via electrical connections which pass through a package body to connect radiofrequency transmission layers disposed on opposing faces of the package body. Commonly, the electrical connection may be orthogonal to the radiofrequency transmission layers, resulting in a pair of angled transitions of 90°.

Such angled transitions are known to be problematic for high performance radiofrequency (RF) devices. In particular, angled transitions comprising interconnections to a circuit or radiofrequency transmission layer housed within a package may require careful impedance matching to ensure high RF performance.

Several techniques and materials are known in the art for forming structures with angled transitions. Ceramic materials may be used as a supporting structure for the radiofrequency transmission layers, in which case electrical connections can be located in holes through the ceramic material. Alternatively, U.S. Pat. No. 7,484,900 describes conductors bent within a plastic material to realise a transition between internal and external conducting layers in an optoelectronic device. The bending of the conductors avoids inductance parasitic effects which may degrade the radiofrequency performance.

A further approach for forming angled transitions uses a coaxial glass bead mounted within the package body. The coaxial glass bead comprises an insulating glass cylinder with a central conducting pin which may be connected to a radiofrequency transmission layer by soldering. This approach has the advantage that a metal package body can be used and frequently results in good radiofrequency performance. Unfortunately, the approach can suffer from problems related to tolerances and process control, particularly when multiple circuits must be interconnected simultaneously.

The skilled person would therefore understand the desirability of an improved angled transition that is suitable for use in high performance RF devices.

SUMMARY OF THE INVENTION

It is an object of the present invention to provide an angled radiofrequency transition which addresses, or at least alleviates, the problems described above.

In accordance with one aspect of the present invention there is provided an RF transition assembly for enabling a radiofrequency transition between an RF transmission layer of an electronic device and a conductor which is electrically connected to the RF transmission layer. The conductor extends generally orthogonal to the RF transmission layer. The assembly comprises an open coaxial structure located adjacent to an edge of the RF transmission layer. The open coaxial structure comprises a cavity extending therethrough for receiving the conductor. The cavity comprises an opening facing the edge of the RF transmission layer so as to direct electromagnetic radiation towards the RF transmission layer. Optionally, at least a portion of the open coaxial structure extends in the plane of the RF transmission layer.

The cavity of the open coaxial structure guides the electromagnetic field generated by radiofrequency structure across the angled transition such that losses through microwave emission can be reduced. Electrical losses at the interfaces of the conducting elements are also reduced by the guidance effect, thereby improving RF transmission through the angled transition.

The guidance of the electromagnetic field provided by the cavity of the open coaxial structure can be varied by altering the size and shape of the cavity. For example, the cavity may have a cross section corresponding to a circular segment and the angle enclosed by the cavity may be greater than 180°. As another example, an angle of between about 180° and 340°, optionally about 240°, may be used.

The open coaxial structure may further comprise one or more ground interconnections between the open coaxial structure and one or more grounding regions associated with the RF transmission layer.

The cavity of the open coaxial structure may extend beyond an end of the conductor adjacent to the RF transmission layer to improve the guidance of the electromagnetic field. For example, the cavity of the open coaxial structure may extend beyond the end of the conductor by a length of at least the radius of the cavity.

The open coaxial structure may be provided with one or more stepped grounding regions adjacent to the conducting layer which are approximately coplanar with one or more grounding regions of the conducting layer. Grounded interconnections may then be made between the one or more stepped grounding regions and one or more grounding regions of the conducting layer.

The RF transition may be used in a package for an electronic device, including for example, an electro-optical modulator.

In accordance with another aspect of the present invention, there is provided an electronic device comprising an RF substrate mounted on a face of a package body. An RF transmission layer is mounted on the RF substrate such that the RF substrate forms a layer between the RF transmission layer and the package body. A conductor is electrically connected to the radiofrequency transmission layer and extends through the package body in a direction generally orthogonal to the RF transmission layer. An open coaxial structure is mounted on the face of the package body adjacent to an edge of the RF transmission layer. The open coaxial structure comprises a cavity extending therethrough for receiving the conductor. The cavity comprises an opening facing the edge of the radiofrequency transmission layer so as to direct electromagnetic radiation towards the radiofrequency transmission layer.

In accordance with another aspect of the present invention, there is provided an RF transition assembly for enabling radiofrequency transitions between a stacked arrangement of RF transmission layers and a conductor. The conductor is electrically connected to each RF transmission layer and extends generally orthogonal to the stacked arrangement of RF transmission layers. An open coaxial structure is located adjacent to the stacked arrangement of RF transmission layers and comprises a cavity extending therethrough for receiving the conductor. The cavity comprises one or more openings facing the edges of the RF transmission layers so as to direct electromagnetic radiation towards each of the RF transmission layers.

BRIEF DESCRIPTION OF THE DRAWINGS

Some preferred embodiments of the invention will now be described by way of example only and with reference to the accompanying drawings. The reference numbers of the designated features are consistently applied in the figures unless otherwise indicated.

DETAILED DESCRIPTION

Figure 1:
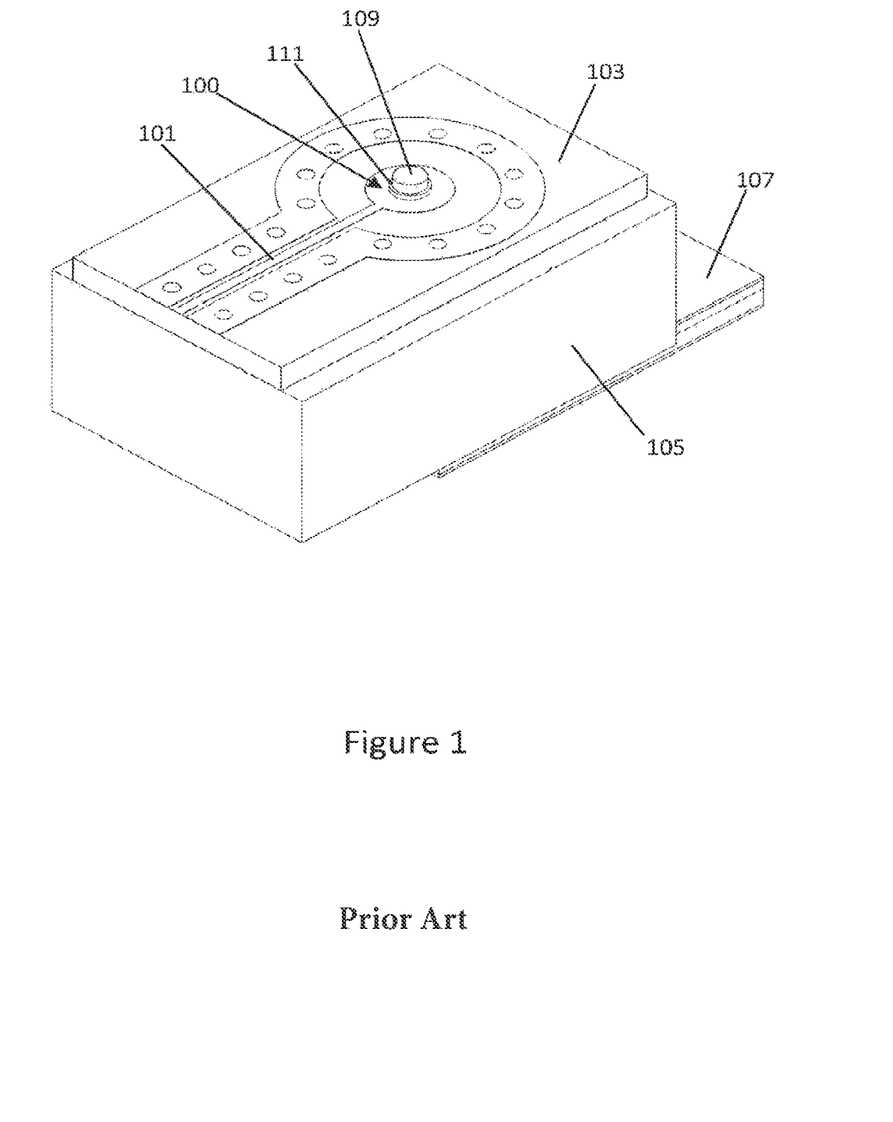
FIG. 1 is a perspective view of a conventional RF transition involving a substrate mounted RF circuit and a coaxial glass bead.

FIG. 1 is a perspective view of a 90° radiofrequency transition 100 known in the art in which an upper RF transmission layer 101, such as a transmission line or RF circuit, mounted in or on an RF substrate 103 is interconnected to a coaxial glass bead (not shown in FIG. 1). The RF substrate 103 is disposed on the upper surface of a package body 105, while an external RF transmission layer 107, such as a flexible circuit, is located on the lower surface of the package body 105. In order to allow transmission of an RF signal from the external RF transmission layer 107 to the upper RF transmission layer 101, the external RF transmission layer 107 and the RF circuit 101 are electrically connected by a pin or central conductor 109 of the coaxial glass bead which passes vertically through the RF substrate 103 and the package body 105, and into the external RF transmission layer 107. The upper RF transmission layer 101 is connected to the central conductor 109 by a solder interconnection 111 to form the RF transition with an angle of 90°.

It will be appreciated that "upper" and "lower" are relative terms, used with respect to the package body 105 as illustrated in the drawings. In use, the device or apparatus may be oriented in any direction.

Figure 2:
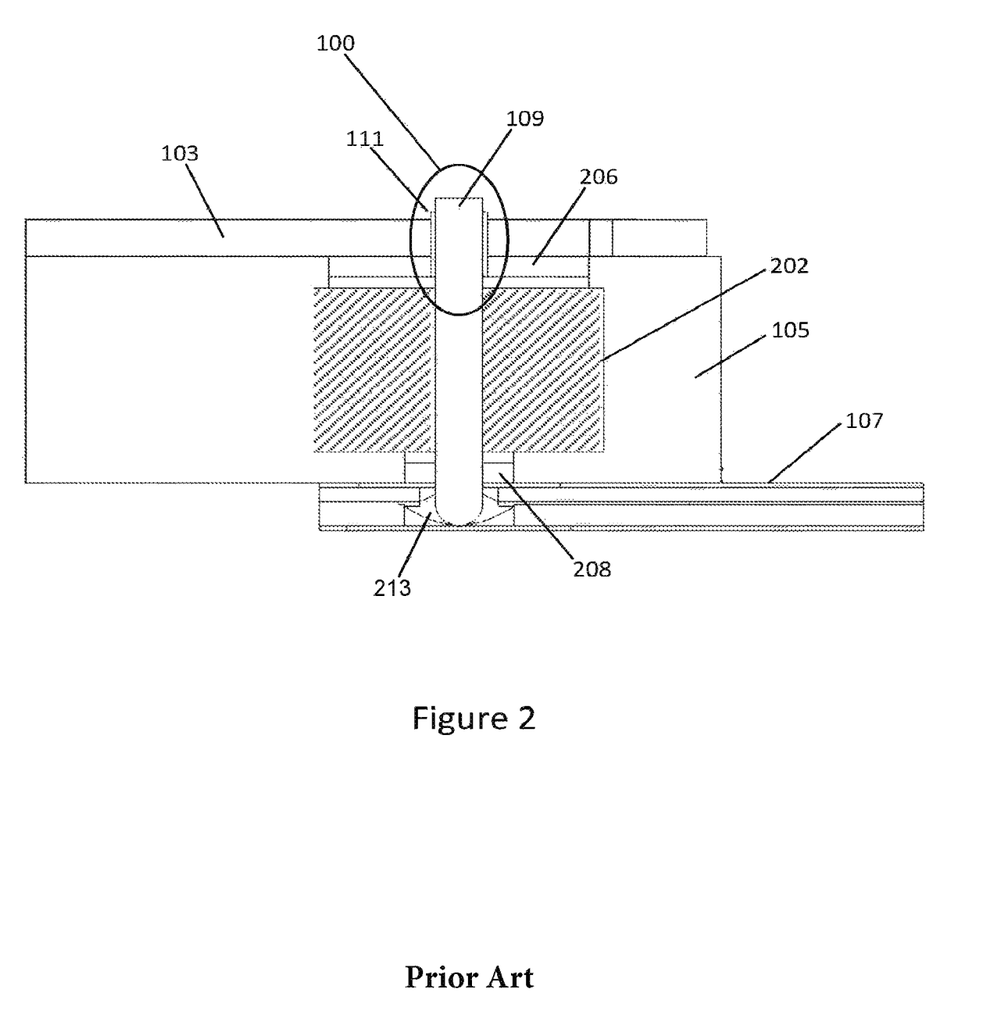
FIG. 2 is a section view of the RF transition shown in FIG. 1.

FIG. 2 is a section view of the 90° RF transition 100 shown in FIG. 1. The coaxial glass bead 202 has a cylindrical body formed of an insulating material and provided with a central bore through which the central conductor 109 is securely mounted. The coaxial glass bead 202 is itself fixed within a void of the package body 105 located between the RF substrate 103 and the external RF transmission layer 107. There may be additional voids 206, 208, in the package body 105 located above and/or below the body of the coaxial glass bead 202 which also serve to insulate the central conductor 109 from the package body 205. The central conductor 109 is electrically connected to the RF circuit by a solder interconnection 213.

Figure 3:
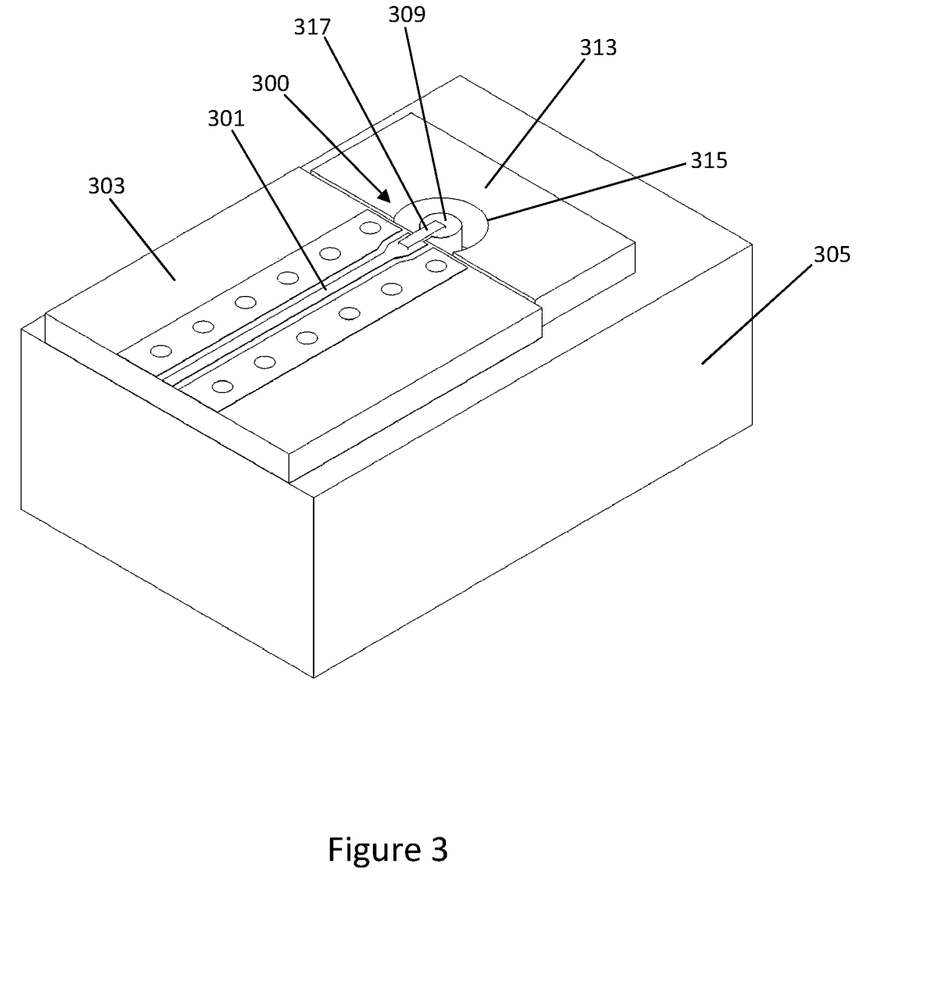
FIG. 3 is a perspective view of an RF transition comprising an open coaxial structure.

FIG. 3 shows a perspective view of an exemplary RF transition 300. In this arrangement, an open coaxial structure 313 is mounted on an upper face of a package body 305 adjacent to an RF transmission layer 301 mounted on an RF substrate 303, which is itself mounted on the upper face of the package body 305. In this example the open coaxial structure 313 is shown as a layer formed on the upper face of the package body 305. The upper end of a central conductor 309 of a coaxial glass bead (not shown in FIG. 3) is also located adjacent to the RF transmission layer 301 and accommodated within a cavity 315 formed in the open coaxial structure 313. The cavity 315 of the open coaxial structure 313 comprises an opening facing the RF transmission layer 301 and may have a cross section corresponding to a circular segment. For example, the cavity 325 may be a cylindrical segment formed by truncating a cylinder in a plane parallel to the axis of the cylinder. The central conductor 309 of the coaxial glass bead and the RF transmission layer 301 may be interconnected by a bonding interconnection 317, such as a ribbon or wire bonding interconnection, or an alternative interconnection technique may be used. In the example shown here, the central conductor 309, the RF transmission layer 301 and the open coaxial structure 313 extend to a similar height above the upper surface of the package body 305.

The cavity 315 of the open coaxial structure 313 guides the electromagnetic field across the 90° angle from the central conductor 309 of the coaxial glass bead towards the RF transmission layer 301, thereby improving the transition feature by reducing RF electrical losses, and leading to improvements in circuit (and device) electrical performance. The angled transition is not limited to a 90° transition and the present invention may also be used for angled transitions of greater than or less than 90°.

The open coaxial structure may be formed from a conductive material or from a dielectric or ceramic which is plated with a conductive material. The open coaxial structure may also be integrated with a conducting package body.

The cavity 315 of the open coaxial structure 313 may enclose an angle of 180°, as would be the case for a semi-cylindrical cavity, or the cavity 315 may enclose an angle that is greater than 0° and less than 360°.

The cavity 315 may enclose an angle greater than 180° as it has been found that this is particularly beneficial in guiding the electromagnetic field. The optimal size or shape of the cavity 313 or the optimal angle enclosed by the cavity 313 may depend on the diameter of the central conductor 309, the material from which the open coaxial structure 313 is formed and any RF performance requirement, such a particular impedance or required transmission frequency. An angle of about 240° has been found to be particularly suitable in forming a 50 Ohm RF transition, for example.

Figure 4:
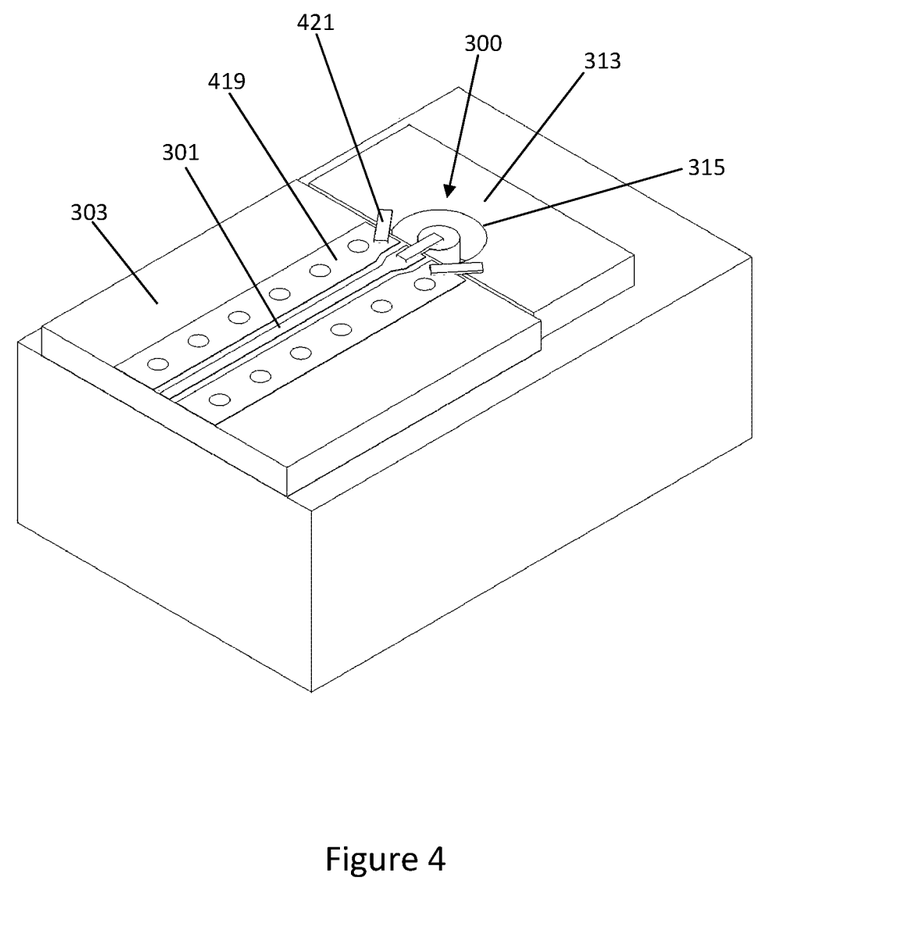
FIG. 4 is a perspective view of an RF transition in which the open coaxial structure is grounded.

FIG. 4 illustrates a modification to the arrangement of FIG. 3 in which the open coaxial structure 313 is electrically grounded to one or more grounding regions 419 located adjacent to the RF transmission layer 301 on the upper surface of the substrate 303. The electrical grounding may be provided by one or more ground interconnections 421 extending between a grounding region 419 of the RF substrate 303 and the open coaxial structure 313. In the arrangement shown here, as in FIG. 3, the cavity encloses more than 180°, and this has the further beneficial effect of improving the ground reporting between the open coaxial structure 313 and the grounding regions 419 by minimising the length of the ground interconnections 421.

Figure 5:
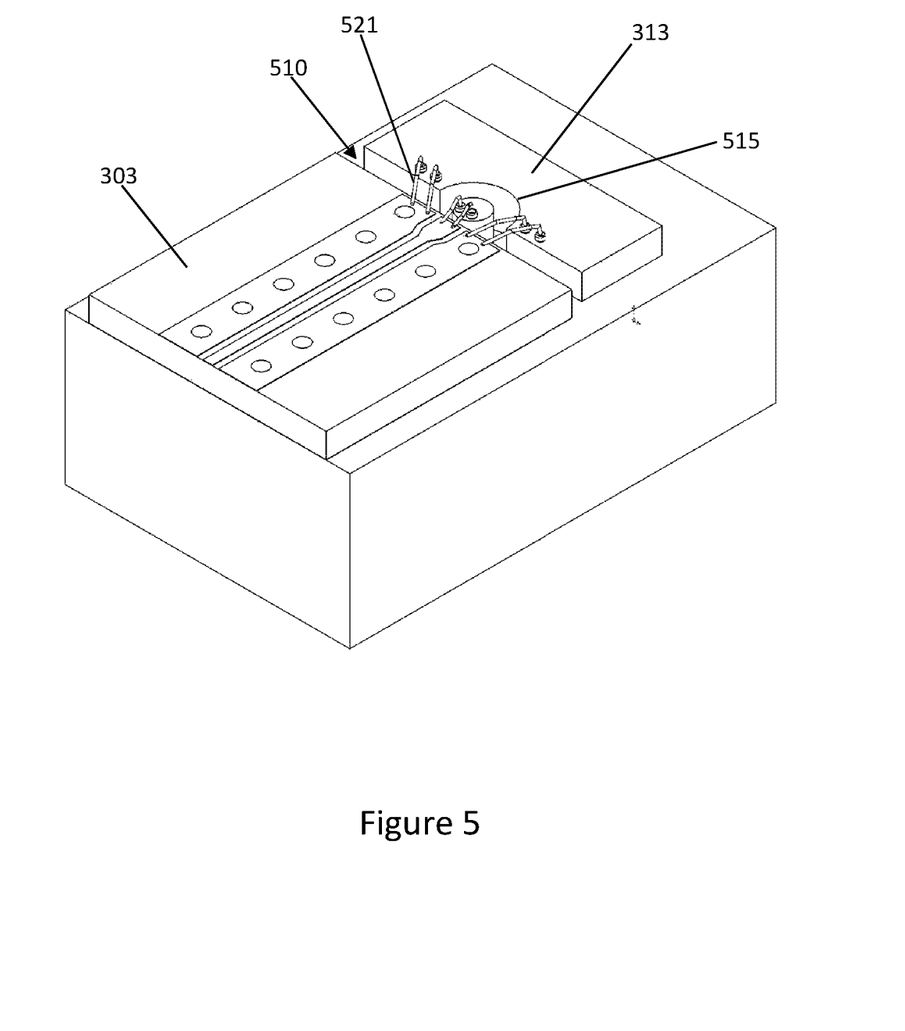
FIG. 5 is a perspective view of a further RF transition in which the open coaxial structure is grounded.

FIG. 5 illustrates a modification to the arrangement of FIG. 4 in which the open coaxial structure 313 is separated from the RF substrate 303 by a gap 510. In this example, the cavity 515 of the open coaxial structure 313 encloses an angle of 180° and the grounded interconnections 521 are wire interconnections.

Figure 6:
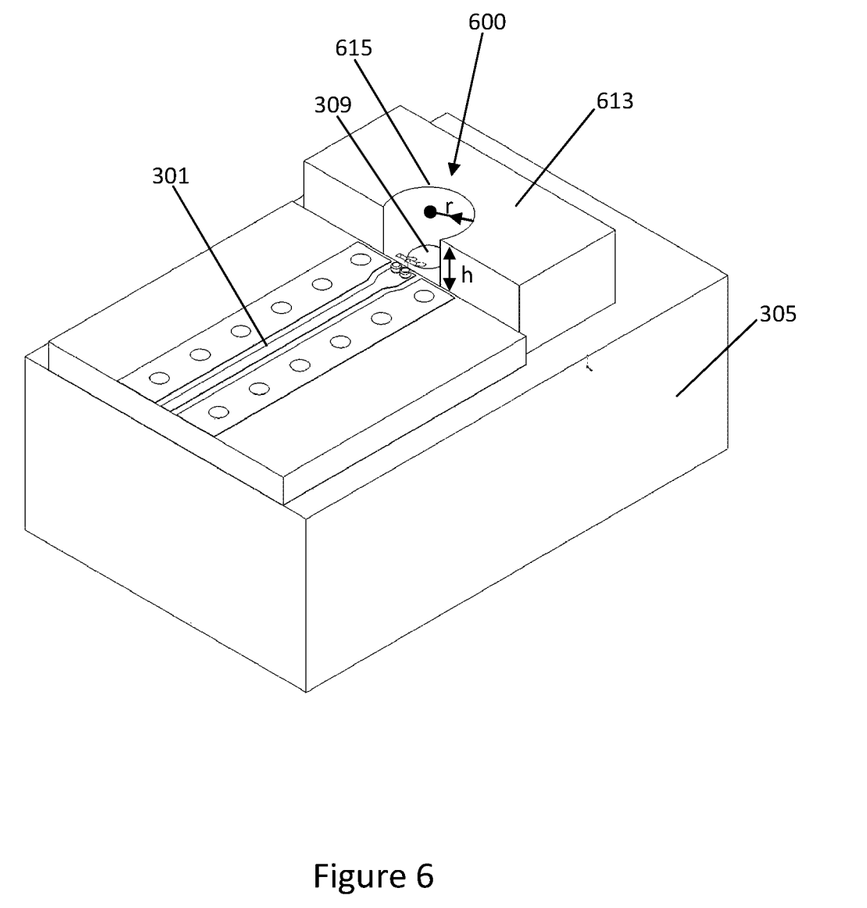
FIG. 6 is a perspective view of an alternative RF transition having an open coaxial structure.

FIG. 6 shows an alternative arrangement for an RF transition 600, in which the open coaxial structure 613 extends in a direction away from the upper surface of the package body 305 such that the open coaxial structure 613 extends above the upper end of the central conductor 309. In this arrangement, the end of the central conductor 309 and the RF transmission layer 301 are a similar height above the upper surface of the package body 305. The extended height of the open coaxial structure 613 with respect to the central conductor 309 produces an additional guidance effect for the electromagnetic field associated with the RF transition. The height h of the open coaxial structure 613 with respect to the central conductor may be optimised to improve the performance of the RF transition such that the height h of the open coaxial structure 613 is approximately equal to or greater than the radius r of the cavity 615 formed in the open coaxial structure 613. Additional height beyond about h=1.1r has relatively small additional benefit.

Figure 7:
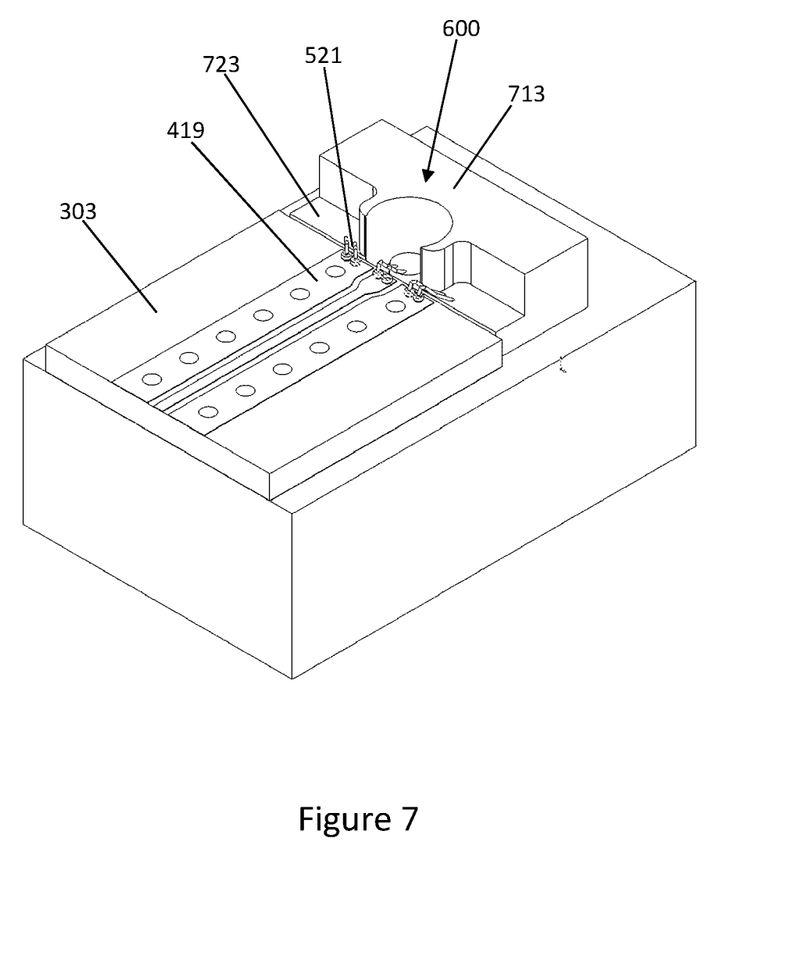
FIG. 7 is a perspective view of a further alternative RF transition.

FIG. 7 illustrates a further modification of the arrangement of FIG. 6, in which the upper surface of the open coaxial structure 713 comprises one or more stepped grounding regions 723 adjacent to the substrate 303 which are lower in height than the remainder of the open coaxial structure 713. Preferably, the one or more stepped grounding regions 723 of the open coaxial structure 713 should be located adjacent to a grounding region 419 of the RF substrate 303 to minimise the length of the grounding interconnections 521 and facilitate ground reporting.

Although the various RF transition assemblies have been exemplified using a coaxial glass bead, alternative conducting structures known in the art can also be used.

While various embodiments of the present invention have been described above, it should be understood that these implementations have been presented by way of example, and not limitation. It would be apparent to one skilled in the relevant art(s) that various changes in form and detail could be made therein without departing from the spirit and scope of the invention. Thus, the present invention should not be limited by any of the above-described exemplary embodiments, but should be defined only in accordance with the following claims and their equivalents.

The invention claimed is:

1. A Radiofrequency (RF) transition assembly for enabling an RF transition between an RF transmission layer of an electronic device and a conductor extending generally orthogonal to the RF transmission layer and being electrically connected to the RF transmission layer, the RF transition assembly comprising:
an open coaxial structure located adjacent to an edge of the RF transmission layer and comprising a cavity extending therethrough for receiving the conductor, the cavity of the open coaxial structure comprising an opening facing the edge of the RF transmission layer so as to direct electromagnetic radiation towards the RF transmission layer, and
a height of the open coaxial structure, with respect to the conductor, being equal to or greater than a radius of the cavity of the open coaxial structure.

2. The RF transition assembly of claim 1, wherein the cavity of the open coaxial structure has a cross section corresponding to a circular segment.

3. The RF transition assembly of claim 1, wherein a cross section of the cavity of the open coaxial structure encloses an angle greater than 180°.

4. The RF transition assembly of claim 1, wherein a cross section of the cavity of the open coaxial structure encloses an angle between about 180° and about 340°.

5. The RF transition assembly of claim 1, further comprising:
one or more ground interconnections between the open coaxial structure and one or more grounding regions of the RF transmission layer.

6. The RF transition assembly of claim 1, wherein at least a portion of the open coaxial structure extends in a plane of the RF transmission layer.

7. A package for the electronic device, the package comprising the RF transition assembly of claim 1.

8. The RF transition assembly of claim 1, wherein a cross section of the cavity of the open coaxial structure encloses an angle of about 240°.

9. The RF transition assembly of claim 1, wherein an end of the conductor is enclosed within the cavity of the open coaxial structure by a portion of the open coaxial structure extending in a direction generally orthogonal to the conductor.

10. The RF transition assembly of claim 1, wherein the open coaxial structure further comprises one or more stepped grounding regions adjacent to the RF transmission layer which are coplanar with one or more grounding regions of the RF transmission layer; and
wherein the RF transition assembly further comprises one or more grounded interconnections between the one or more stepped grounding regions and the one or more grounding regions of the RF transmission layer.

11. An electronic device comprising:
a package body;
a radiofrequency (RF) substrate mounted on a face of the package body;
an RF transmission layer mounted on the RF substrate such that the RF substrate forms a layer between the RF transmission layer and the package body;
a conductor electrically connected to the RF transmission layer and which extends through the package body in a direction generally orthogonal to the RF transmission layer; and
an open coaxial structure located on the face of the package body adjacent to an edge of the RF transmission layer,
the open coaxial structure comprising a cavity extending therethrough for receiving the conductor,
the cavity comprising an opening facing the edge of the RF transmission layer so as to direct electromagnetic radiation towards the RF transmission layer, and
a height of the open coaxial structure, with respect to the conductor, being equal to or greater than a radius of the cavity.

12. The electronic device of claim 11, wherein a cross section of the cavity encloses an angle of about 240°.

13. The electronic device of claim 11, wherein the open coaxial structure is separated from the RF substrate by a gap.

14. The electronic device of claim 11, wherein the open coaxial structure further comprises:
   one or more stepped grounding regions adjacent to the RF transmission layer which are coplanar with one or more grounding regions of the RF transmission layer; and
   wherein the electronic device further comprises:
      one or more grounded interconnections between the one or more stepped grounding regions and the one or more grounding regions of the RF transmission layer.

15. The electronic device of claim 11, wherein the cavity has a cross section corresponding to a circular segment.

16. The electronic device of claim 11, wherein a cross section of the cavity encloses an angle greater than 180°.

17. The electronic device of claim 11, wherein a cross section of the cavity encloses an angle between about 180° and about 340°.

18. The electronic device of claim 11, further comprising:
   one or more ground interconnections between the open coaxial structure and one or more grounding regions of the RF transmission layer.

19. The electronic device of claim 11, wherein at least a portion of the open coaxial structure extends in a plane of the RF transmission layer.

20. The electronic device of claim 11, wherein an end of the conductor is enclosed within the cavity by a portion of the open coaxial structure extending in a direction generally orthogonal to the conductor.

\* \* \* \* \*